(12) United States Patent
Anderson et al.

(10) Patent No.: US 7,352,025 B2
(45) Date of Patent: Apr. 1, 2008

(54) SEMICONDUCTOR MEMORY DEVICE WITH INCREASED NODE CAPACITANCE

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/596,029

(22) PCT Filed: Dec. 8, 2003

(86) PCT No.: PCT/US03/39026

§ 371 (c)(1), (2), (4) Date: May 25, 2006

(87) PCT Pub. No.: WO2005/064682

PCT Pub. Date: Jul. 14, 2005

(65) Prior Publication Data

US 2007/0085134 A1    Apr. 19, 2007

(51) Int. Cl.
*H01L 29/76* (2006.01)

(52) U.S. Cl. .................................... 257/314

(58) Field of Classification Search ............ 257/314, 257/336, 350, E21.442, E27.112, E29.257, 257/900

See application file for complete search history.

(56) References Cited

U.S. PATENT DOCUMENTS

| 3,387,286 | A | | 6/1968 | Dennard | |
|---|---|---|---|---|---|
| 5,578,513 | A | * | 11/1996 | Maegawa | 438/151 |
| 6,100,128 | A | | 8/2000 | Wang et al. | |
| 6,130,470 | A | | 10/2000 | Selcuk | |
| 6,140,171 | A | | 10/2000 | Allen et al. | |
| 6,165,849 | A | | 12/2000 | An et al. | |
| 6,359,311 | B1 | * | 3/2002 | Colinge et al. | 257/347 |
| 6,551,883 | B1 | | 4/2003 | Yen et al. | |
| 6,583,469 | B1 | * | 6/2003 | Fried et al. | 257/329 |
| 6,689,650 | B2 | * | 2/2004 | Gambino et al. | 438/157 |
| 6,909,151 | B2 | * | 6/2005 | Hareland et al. | 257/369 |
| 6,936,875 | B2 | * | 8/2005 | Sugii et al. | 257/288 |
| 6,962,843 | B2 | * | 11/2005 | Anderson et al. | 438/212 |
| 6,974,729 | B2 | * | 12/2005 | Collaert et al. | 438/157 |
| 6,992,354 | B2 | * | 1/2006 | Nowak et al. | 257/347 |
| 7,074,656 | B2 | * | 7/2006 | Yeo et al. | 438/157 |
| 7,087,499 | B2 | * | 8/2006 | Rankin et al. | 438/412 |
| 7,173,303 | B2 | * | 2/2007 | Gambino et al. | 257/302 |
| 7,183,182 | B2 | * | 2/2007 | Cabral et al. | 438/517 |
| 2002/0181273 | A1 | | 12/2002 | Nii et al. | |
| 2003/0038303 | A1 | | 2/2003 | Hashimoto et al. | |
| 2003/0042519 | A1 | | 3/2003 | Tzeng et al. | |

* cited by examiner

*Primary Examiner*—Nathan W Ha
(74) *Attorney, Agent, or Firm*—H. Daniel Schnurmann

(57) ABSTRACT

An integrated circuit semiconductor memory device having the BOX layer removed from under the gate of a storage transistor to increase the gate-to-substrate capacitance and reduce the soft error rate. The increased node capacitance thus obtained is achieved without requiring a corresponding increase in area.

14 Claims, 4 Drawing Sheets

US 7,352,025 B2

SEMICONDUCTOR MEMORY DEVICE WITH INCREASED NODE CAPACITANCE

BACKGROUND ART

This invention relates to an integrated circuit semiconductor memory device such as an SRAM (Static Random Access Memory) or latch that provides increased node capacitance for protection against soft errors.

Semiconductor memory devices such as RAM (random access memory) generally include a number of memory cells each formed of a number of transistors. Generally, two storage transistors are coupled between two pass gate transistors, and a bit line is coupled to each of the pass gate transistors. Each pass gate transistor has a gate electrode coupled to a word line, and an address signal is provided on the word line associated with a particular memory cell in order to select that memory cell and read out the stored data therefrom. With the memory cell so selected, its data is read out from the memory node of the memory cell (or data is written therein) through the pass gate transistors via the bit lines. It is of course important that the data stored in the memory cell remain unchanged until it is read out.

There has been a growing difficulty in preserving such stored data as the scale of integration grows higher and higher and the physical size of the memory cell elements decreases. This difficulty arises from what are known as soft errors, which are caused primarily by an alpha particle striking one of the memory nodes, or may be caused by circuit noise. This can cause the voltage on the memory nodes to change, sometimes sufficiently so that a logic 1 is transformed into a logic 0 or vice versa. The amount of voltage change for a given alpha particle hit is inversely proportional to the capacitance on the memory node, and so a relatively large capacitance on the memory node reduced the amount of voltage change for a given alpha particle hit and correspondingly reduces the chance of a soft error.

With the relatively large devices of smaller scale integration, there was sufficient node capacitance to prevent soft errors most of the time. However, as the dimensions of the memory cells are scaled down to fit more devices on the chip, the node capacitances are getting correspondingly very low. In addition, the applied voltage Vdd is also being scaled down with device size, again leading to reduced node capacitance. The result is a high susceptibility to circuit noise and radiation, which in turn leads to an unacceptably high soft error rate.

It would therefore be highly desirable to increase the node capacitances of SRAMs, latches and the like without resorting to increasing the device size again.

OBJECTS AND SUMMARY OF THE INVENTION

Accordingly, it is an object of the present invention to provide a semiconductor memory device that avoids the above-discussed difficulties of the prior art.

It is another object of the present invention to provide a semiconductor memory device having increased node capacitance to enable a low soft error rate.

It is yet another object of the present invention to provide a semiconductor memory device having increased node capacitance without requiring an increase in area.

The above objects, as well as additional advantages, will be realized in the practice of the invention as herein described. In its broadest embodiment, the integrated circuit semiconductor memory device comprises a substrate with a first dielectric layer covering a first portion of the substrate, the first dielectric layer being absent from a second portion of the substrate. The device further comprises a second dielectric layer having a property different from the first dielectric layer, the second dielectric layer at least partly covering the second portion of the substrate. A source region is formed in a first doped region on the first dielectric layer, a drain region is formed in a second doped region on the first dielectric layer, and a gate is formed over the second dielectric layer and between the first and second doped regions. In accordance with an important aspect of the present invention, the property of the second dielectric layer provides a gate capacitance of the gate with respect to the substrate that is greater than a theoretical capacitance of a gate formed over the first dielectric layer on the substrate.

In an advantageous aspect of the invention, the memory device is an SRAM memory cell, advantageously an FET or especially a FinFET.

In one preferred embodiment, the first dielectric layer is a buried oxide layer and the second dielectric layer is a thin oxide layer providing less insulating effect than the buried oxide layer, the gate being capacitively coupled to the substrate.

In another preferred embodiment, the device is a FinFET having a fin and further comprises a gate dielectric layer between the gate and the fin, wherein the second dielectric layer has less leakage than the gate dielectric layer.

In yet another preferred embodiment, the substrate has an upwardly-facing first surface at an upper level and an upwardly-facing second surface at a lower level, the first dielectric layer being a buried oxide layer formed on the first surface and the second dielectric layer being a thin oxide layer formed on the second surface.

In a further preferred embodiment, a bulk process produces a layout in which the first dielectric layer is a buried oxide layer and the second dielectric layer is a thin oxide layer providing less insulating effect These and other objects, features and aspects of the present invention will be apparent from the following description of the preferred embodiments taken in conjunction with the attached drawings.

BRIEF DESCRIPTION OF DRAWINGS

The invention will be further described with reference to the drawings in which similar elements in different drawings are represented by numbers having the final two digits in common.

DETAILED DESCRIPTION OF THE INVENTION

In the following discussion, the prior art and the embodiments of the present invention will be described in the context of FinFETs. A FinFET is a double-gate MOSFET that is formed by defining and etching a thin, vertical fin in the silicon body of an SOI wafer to connect the source and drain regions. Polysilicon gate electrodes are defined surrounding the fin. In the embodiments discussed below, the double gates are on the right and left sides of the fin and are connected by a portion of the gate passing over the fin. When the FinFET is turned on, the current flow is from source to drain along both the left and right vertical edges of the fin.

It will be apparent to those of ordinary skill in the art that the following discussion and the accompanying drawings do not reference the complete structure of FinFETs generally or any FinFET in particular, but rather schematically define and compare only those elements of a FinFET useful for explaining the present invention. The elements omitted or simplified do not affect the following discussion. Accordingly, it should be understood that the invention is to be applied in the context of actual memory cell structures incorporating all necessary elements.

Figure 1:
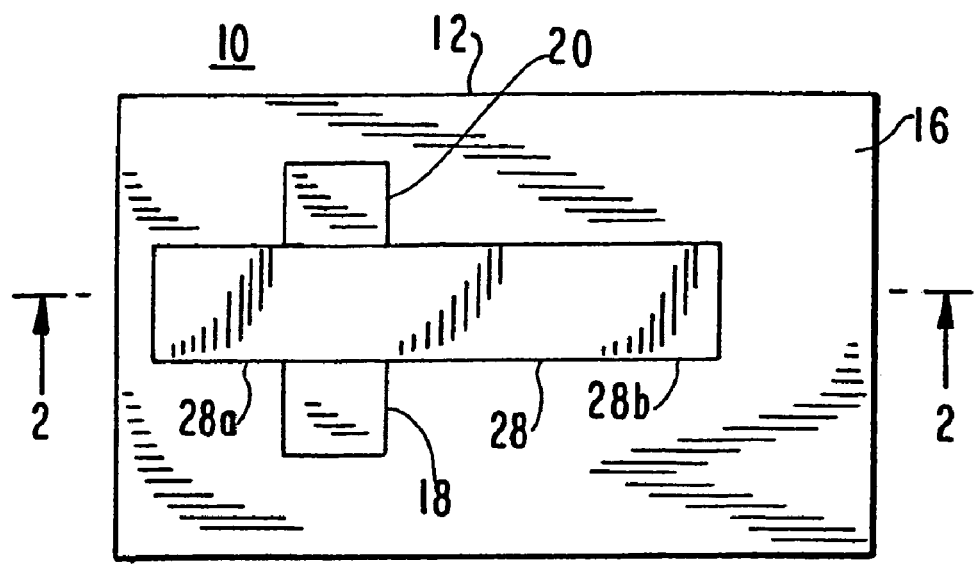
FIG. 1 is a schematic top plan view of a conventional FinFET.
Figure 2:
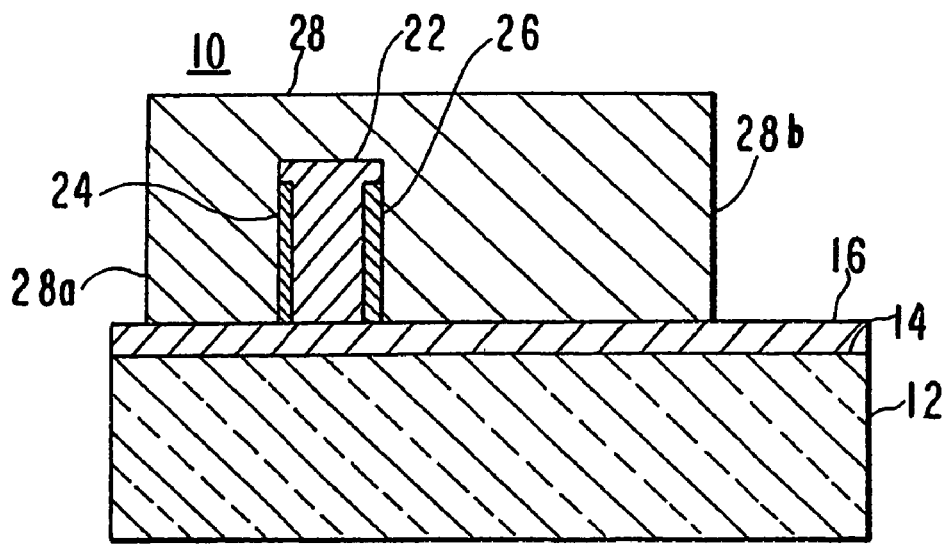
FIG. 2 is a schematic cross-sectional view of the conventional FinFET taken along arrows A-A in FIG. 1.

Thus, with reference to FIG. 1, a conventional FinFET 10 is schematically illustrated as forming an element of a semiconductor memory device on an integrated circuit chip, with FIG. 2 being a side cross-sectional view as indicated. The conventional FinFET 10 is formed with a substrate 12 which has on its upper surface 14 a buried oxide (BOX) layer 16. The FinFET 10 has a source region 18 formed in a first doped region on the BOX layer 16, a drain region 20 formed in a second doped region on the BOX layer 16 and a vertically projecting fin 22 connecting the source and drain regions 18, 20. As shown in FIG. 2, the fin 22 is also formed on the BOX layer 16, and includes sidewalls 24, 26 of thin oxide. In addition, the FinFET 10 includes a gate 28 that serves as the control electrode for activating the FinFET 10, with two gate portions 28a, 28b, one on each side of the fin 22. With this construction, the BOX layer 16 under the gate 28 provides insufficient capacitance in larger scale integrations where the area of the gate 28 has been substantially reduced.

Figure 3:
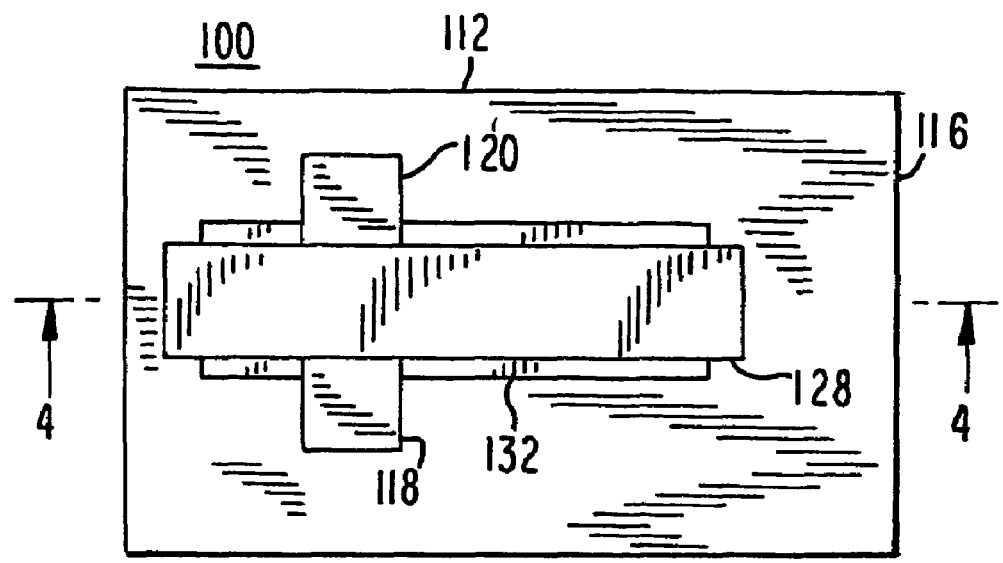
FIG. 3 is a schematic top plan view of a FinFET in accordance with a first preferred embodiment of the present invention.
Figure 4:
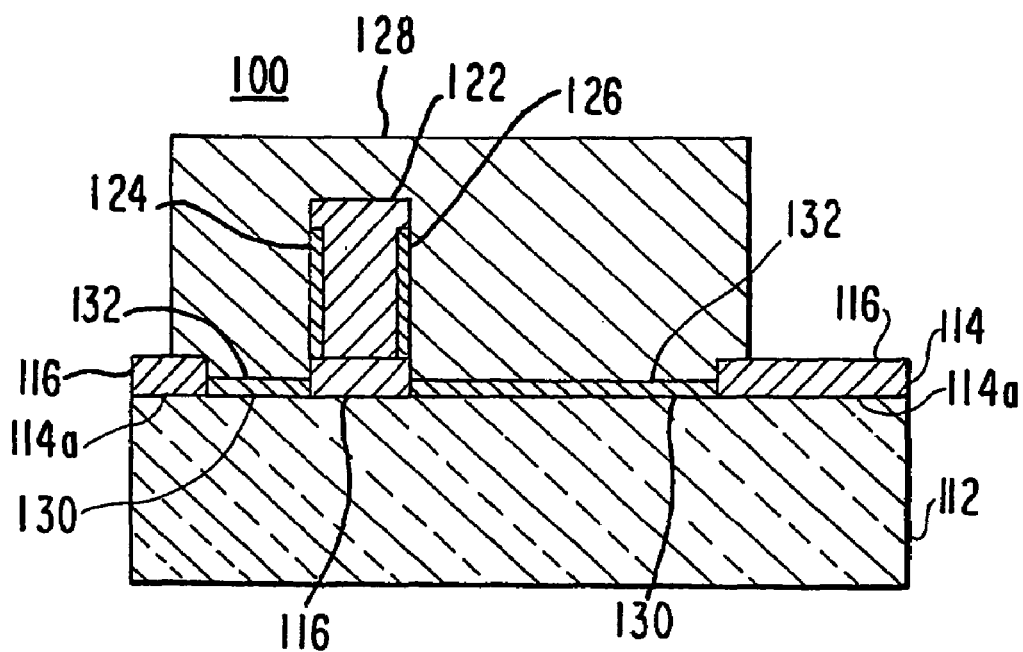
FIG. 4 is a schematic cross-sectional view of the FinFET in accordance with the first preferred embodiment of the present invention taken along arrows B-B in FIG. 3.

The present invention provides a solution to this problem without requiring an increase in physical size of the memory cell elements. FIGS. 3 and 4 are respectively top plan and side cross-sectional views of a first preferred embodiment of the present invention, corresponding to FIGS. 1 and 2. In FIGS. 3 and 4, a FinFET 100 is formed with a substrate 112 which has on a first portion 114a of its upper surface 114 a buried oxide (BOX) layer 116, which is a dielectric material having defined properties. The FinFET 100 has a source region 118 formed in a first doped region on the BOX layer 116, a drain region 120 formed in a second doped region on the BOX layer 116 and a vertically projecting fin 122 connecting the source and drain regions 118, 120. As shown in FIG. 4, the fin 122 is also formed on the BOX layer 116, and includes sidewalls 124, 126 of thin oxide.

In accordance with the present invention and in distinction from the prior art, the BOX layer 116 does not cover the entire portion of the substrate 112 underlying the FinFET 100, but rather is absent from at least a second portion 130 of the substrate 112. Instead, a second, different dielectric layer 132 is provided on this second portion 130. The second dielectric layer 132 is formed of a dielectric material that has different properties from the dielectric material forming the BOX layer 116, in particular a different dielectric coefficient and/or a different thickness. The gate 128 of the FinFET 100 is formed on the second dielectric layer 132, which in this embodiment is a thin oxide layer.

In the present invention, the thin oxide layer 132 increases the node capacitance by replacing the BOX layer 116 and thereby permitting the gate 128 to be capacitively coupled to the substrate 112. That is, this thin oxide (second dielectric) layer 132 provides a gate capacitance of the gate 128 with respect to the substrate 112 that is greater than a theoretical capacitance of a gate formed over the BOX (first dielectric) layer 116.

Of course, there may be other portions of the substrate 112 not covered by either the BOX layer 116 or the thin oxide layer 1132.

One method for producing the FinFET 100 would be to add the steps of forming a block mask for BOX removal and then etching the BOX.

Figure 5:
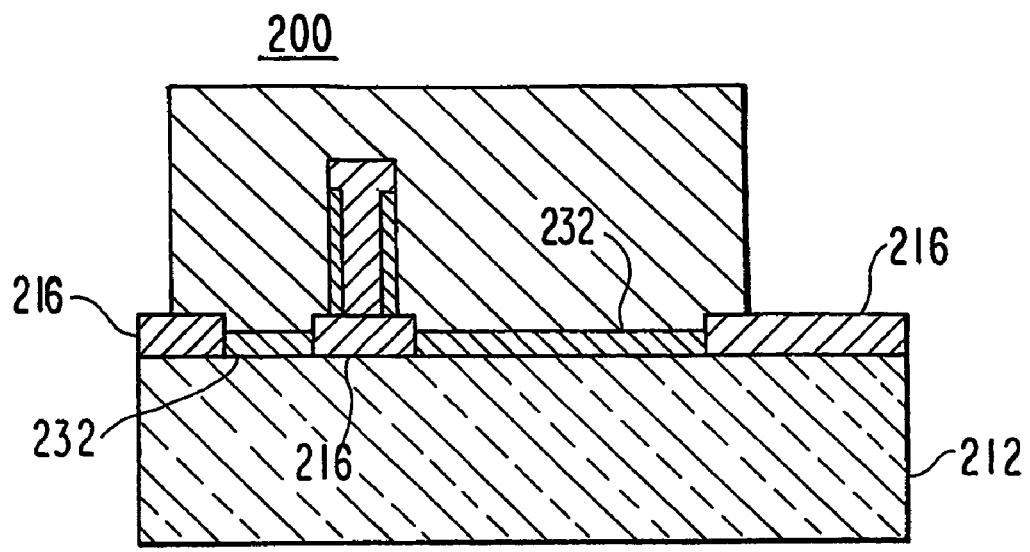
FIG. 5 is a schematic cross-sectional view of a portion of a FinFET in accordance with a second preferred embodiment of the present invention.

FIG. 5 is a schematic side cross-sectional view of another preferred embodiment. In the FinFET 200 of FIG. 5, the thin oxide second dielectric layer 132 of the first embodiment is replaced by a thicker oxide layer 232 which has a different dielectric coefficient than that of the material forming the BOX layer 216 to reduce gate leakage. The oxide layer 232 may be formed by additional process steps to deposit or grow the dielectric material and then mask and etch the dielectric material into the proper areas.

In this and in other embodiments, the side walls on either side of the fin are advantageously in the form of thin dielectric layers between the gate and the fin, and are made of a dielectric material having less leakage than the Box layer 116.

Figure 6:
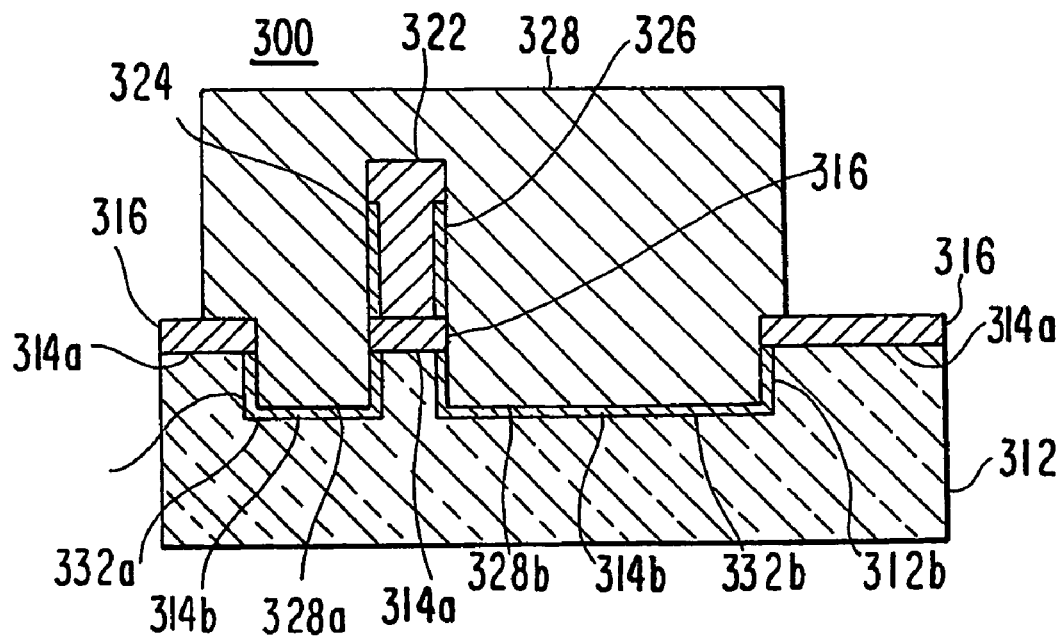
FIG. 6 is a schematic cross-sectional view of a portion of a FinFET in accordance with a third preferred embodiment of the present invention.

FIG. 6 illustrates a third preferred embodiment. Here, when the BOX layer 316 is removed by, for example, etching in making the FinFET 300, the etching continues into the substrate 312 so that the lower portions 328a, 328b of the gate 328 fit into depressions 312a, 312b in the substrate 312. Accordingly, the substrate 312 has an upwardly-facing first surface 314a at an upper level and an upwardly-facing second surface 314b at a lower level. The additional etching of the silicon substrate 312 can be an additional process or a continuation of the BOX etching process. This structure then uses thin oxide layers 332a, 332b along the bottom and sides of the lower portions 328a, 328b, as well as thin oxide sidewalls 324, 326 on the sides of the fin 322.

Figure 7:
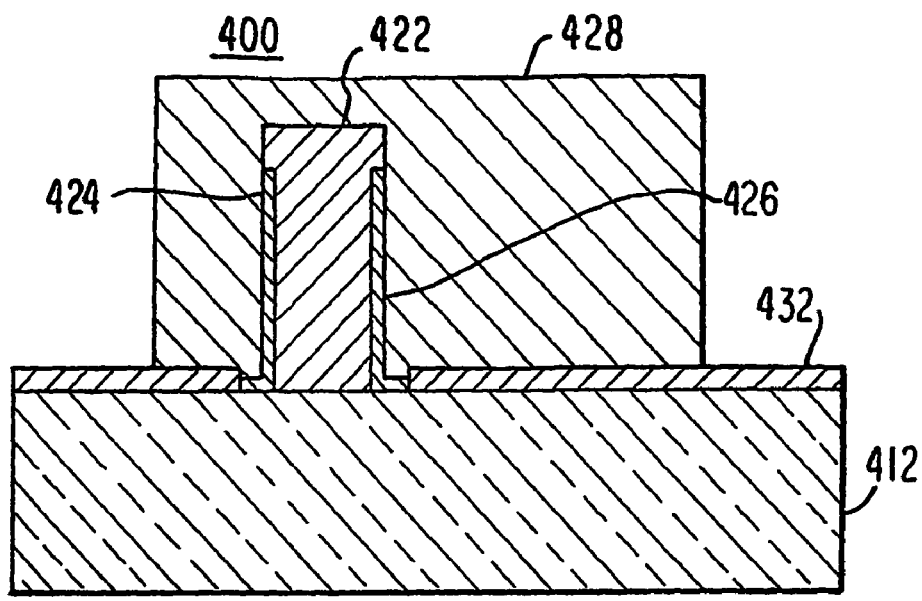
FIG. 7 is a schematic cross-sectional view of a portion of a FinFET in accordance with a fourth preferred embodiment of the present invention.
Figure 8:
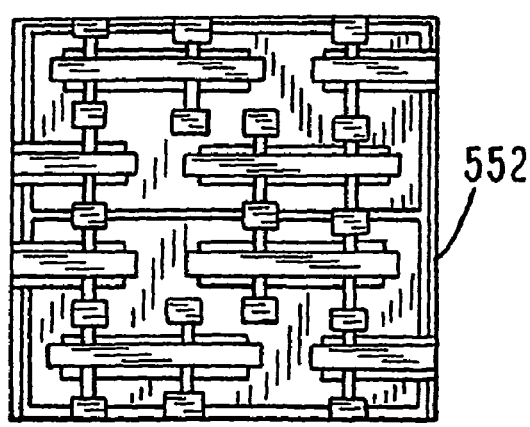
FIG. 8 is a schematic illustration of an SRAM layout including FinFETs in accordance with the present invention.

In a bulk process for creating plural memory cells, it is advantageous to grow a thick oxide layer or deposit dielectric under the gate to create a dielectric layer that is different from the dielectric material on the transistor to reduce leakage from the gate to the substrate. FIG. 7 illustrates schematically a single FinFET 400 from such a bulk process, having this second dielectric layer 432 on the substrate 412 under the gate 428. The fin 422 includes sidewalls 424, 426 of thin oxide. FIG. 8 illustrates a FinFET SRAM layout 550 in which the FinFETs have the structure of FinFET 552 produced in accordance with the present invention.

In an alternative process, the substrate may be doped so that oxide grows much faster on the substrate than on the FinFET, so that the difference in dielectric effect, and hence in capacitance, arises from the differential thickness of the oxide layer.

What is claimed is:

1. An integrated circuit semiconductor memory device provided with a semiconductor fin comprising:

a substrate;

a first dielectric layer covering a first portion of said substrate, said first dielectric layer being absent from a second portion of said substrate;

a second dielectric layer having a property different from said first dielectric layer, said second dielectric layer at least partly covering said second portion of said substrate;

a source region formed in a first doped region on said first dielectric layer;

a drain region formed in a second doped region on said first dielectric layer; and a gate formed over said second dielectric layer and between said first and second doped regions, wherein said substrate has an upwardly facing first surface at an upper level and an upwardly facing second surface at a lower level, said first dielectric layer being a dielectric layer formed on said first surface, said second dielectric layer being a dielectric layer formed on said second surface, and said fin being formed over said first dielectric layer.

2. The device of claim 1, wherein said device is RAM.

3. The device of claim 1, wherein said device is SRAM.

4. The device of claim 1, wherein said device includes a FET.

5. The device of claim 4, wherein said FET is a FinFET.

6. The device of claim 5, wherein said first dielectric layer is a buried oxide layer and said second dielectric layer is a thin oxide layer providing less insulating effect than said buried oxide layer, said gate being capacitively coupled to said substrate.

7. The device of claim 6, wherein a fin of said FinFET is formed over said buried oxide layer.

8. The device of claim 5, wherein said device further comprises a fin and a gate dielectric layer between said gate and said fin, wherein said second dielectric layer has less leakage than said gate dielectric.

9. The device of claim 1, wherein said first dielectric layer is a buried oxide layer and said second dielectric layer is a thin oxide layer.

10. The device of claim 1, wherein said first dielectric layer is a buried oxide layer and said second dielectric layer is a thin oxide layer providing less insulating effect than said buried oxide layer, said gate being capacitively coupled to said substrate.

11. The device of claim 1, wherein said device further comprises a fin and a gate dielectric layer between said gate and said fin, wherein said second dielectric layer has less leakage than said gate dielectric.

12. The device of claim 1, wherein said substrate has an upwardly-facing first surface at an upper level and an upwardly-facing second surface at a lower level, said first dielectric layer being a dielectric layer formed on said first surface, said second dielectric layer being a thin dielectric layer formed on said second surface, and a fin of said FinFET being formed over said buried layer.

13. The device of claim 11, wherein said first dielectric layer is a buried oxide layer and said second dielectric layer is a thin oxide layer.

14. The device of claim 1, wherein said property of said second dielectric layer provides a gate capacitance of said gate with respect to said substrate that is greater than a theoretical capacitance of a gate formed over said first dielectric layer on said substrate.

* * * * *